Figure 1:
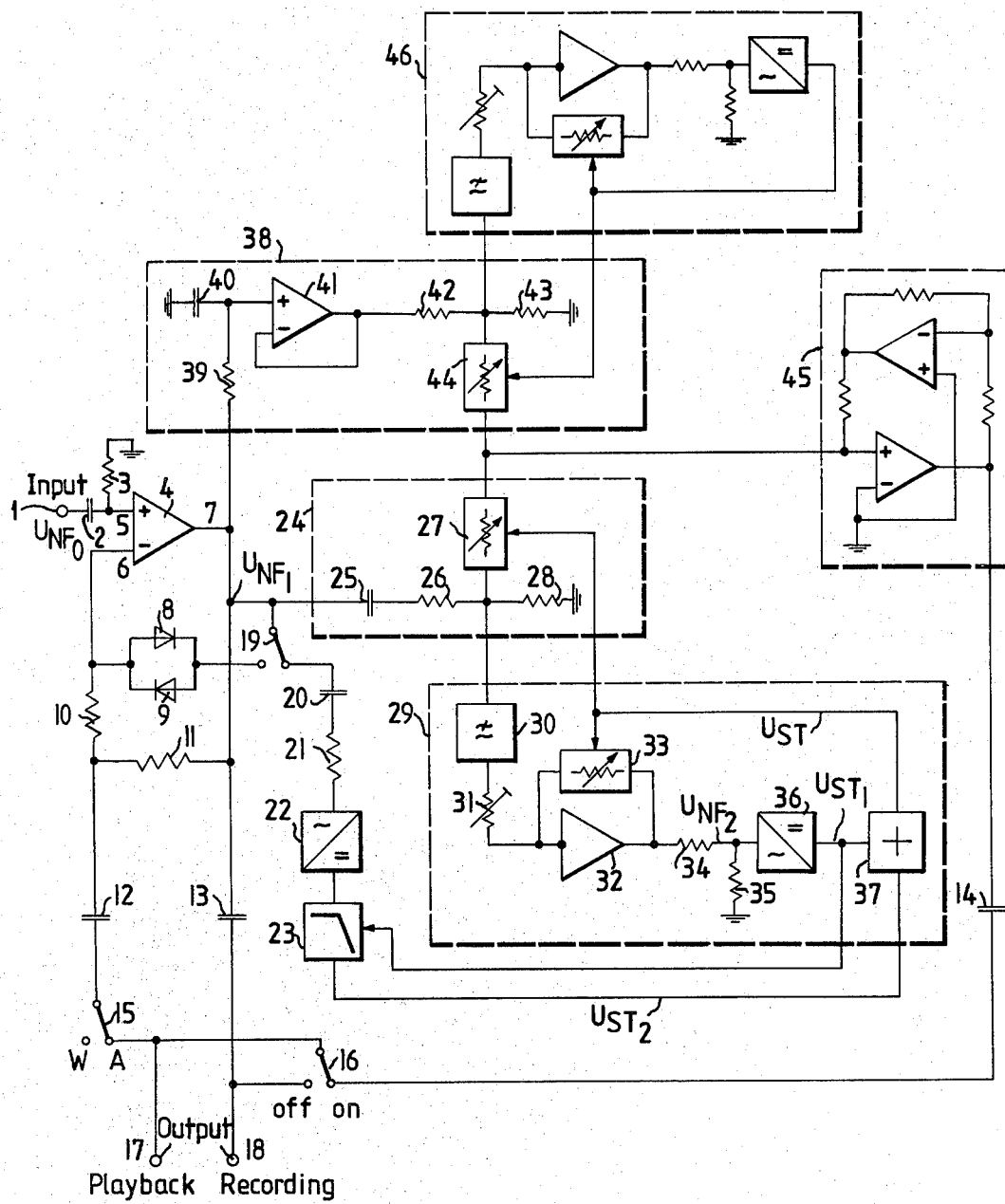

United States Patent [19]

Scholz

[11] 4,319,205
[45] Mar. 9, 1982

[54] CONTROL VOLTAGE GENERATOR FOR A SYSTEM FOR DYNAMIC COMPRESSION OR EXPANSION

[75] Inventor: Werner Scholz, Gehrden, Fed. Rep. of Germany

[73] Assignee: Licentia Patent-Verwaltungs-G.m.b.H., Frankfurt am Main, Fed. Rep. of Germany

[21] Appl. No.: 121,722

[22] Filed: Feb. 15, 1980

[30] Foreign Application Priority Data

Feb. 17, 1979 [DE] Fed. Rep. of Germany ....... 2906192

[51] Int. Cl.³ .............................................. H04B 1/64
[52] U.S. Cl. ..................................... 333/14; 307/562; 330/279
[58] Field of Search .................. 333/14; 307/261, 264, 307/546, 562; 330/129, 141, 279, 278

[56] References Cited

U.S. PATENT DOCUMENTS

| 3,199,044 | 8/1965 | Morris | 330/141 X |
| 4,037,163 | 7/1977 | Nicholas | 307/264 X |
| 4,103,239 | 7/1978 | Meewezen | 333/14 X |
| 4,114,115 | 9/1978 | Minnis | 333/14 |
| 4,145,664 | 3/1979 | Takaoka et al. | 333/14 X |
| 4,218,662 | 8/1980 | Schroder | 333/14 |

Primary Examiner—Paul L. Gensler
Attorney, Agent, or Firm—Spencer & Kaye

[57] ABSTRACT

A control voltage generator is described for a system for dynamic compression and/or expansion. The voltage generator has a series circuit consisting of a first controllable amplifier and a first rectifying circuit and a further controllable amplifier in the intelligence signal path. For effecting a rapid matching of the control voltage when the input signal suddenly increases in amplitude a further rectifying circuit is provided. The input of the further rectifying circuit is connected to the signal path before the first controllable amplifier and the output to the output of the first rectifying circuit.

13 Claims, 7 Drawing Figures

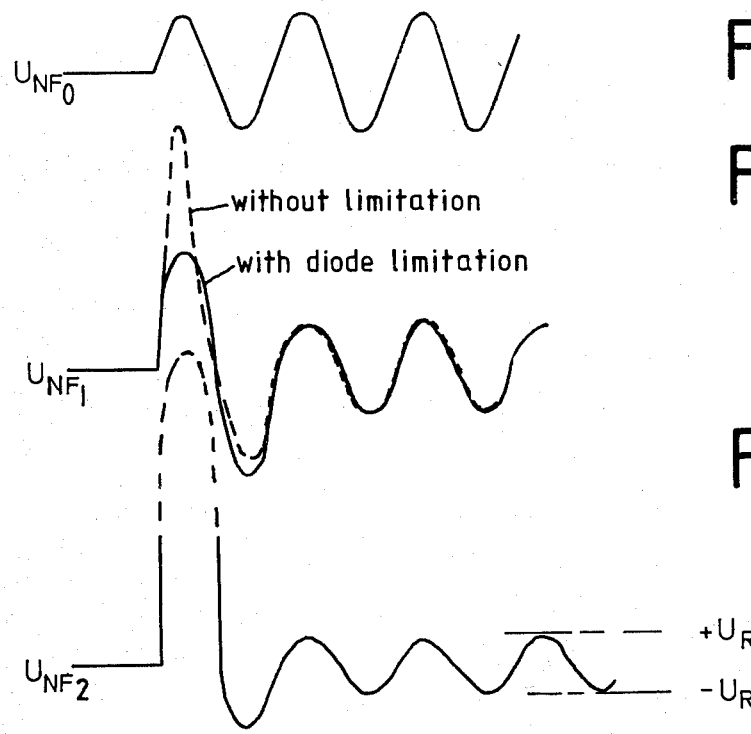
FIG.3a
FIG.3b
FIG.3c
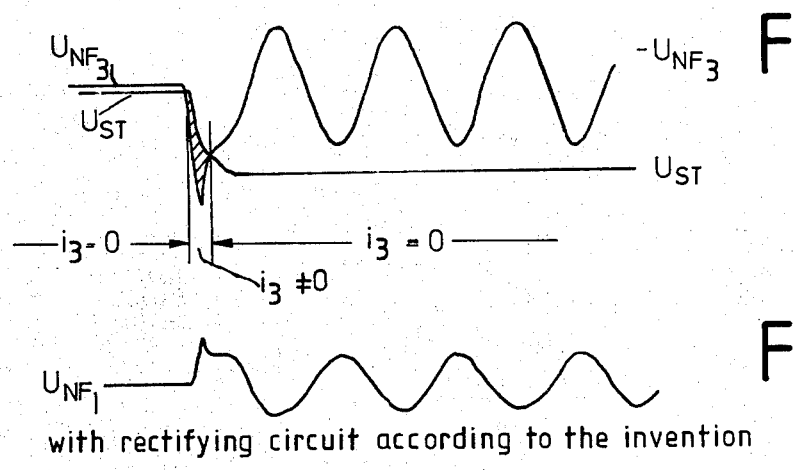
FIG.3d
FIG.3e
with rectifying circuit according to the invention

CONTROL VOLTAGE GENERATOR FOR A SYSTEM FOR DYNAMIC COMPRESSION OR EXPANSION

The invention relates to a control voltage generator for a system for dynamic compression and/or expansion in accordance with the statement of type in patent claim 1. Such a control voltage generator serves to obtain a control voltage from the useful signal and to apply it to the adjusting members of a compander for adjusting the amplification. In normal operation the response time of the control voltage is such that the curve of the useful signals is reproduced without appreciable distortion. Upon a sudden rise of amplitude, however, this response time is too long to effect a sufficiently rapid matching of amplification. Hence amplitude peaks may lead to overcontrol of the transmission channel following the compressor, e.g. recording apparatus.

In this case of operation it is possible to effect direct limitation of the useful signal, i.e. avoiding corresponding control of the adjusting members. A directly limited useful signal cannot however immediately be expanded in complementary manner. Indeed, during compression there is a slower matching of the control voltage to the large amplitude value than would be the case without limiting means. The amplification during expansion also varies correspondingly slowly. Furthermore, the limiting means may respond at very large stationary amplitudes and effect distortion of the useful signal voltage.

The invention is therefore based on the problem, in a system for dynamic compression and/or expansion, of effecting a rapid matching of the control voltage for the adjusting members and therefore of the amplification as soon as the input signals suddenly increase in amplitude. This problem is solved, in a control voltage generator in accordance with the statement of type in claim 1, by the features given in the characterising part.

Developments and advantageous practical forms are given in the subclaims.

The invention has the following advantageous properties: the disadvantages referred to in connection with direct limiting are avoided. The time of matching of the amplification upon a sudden increase of amplitude is appreciably shortened. In normal operation there is therefore no influencing of the control voltage. The response time for the control voltage generation effective in normal operation may therefore be arranged to be optimal, without regard to the matching time upon amplitude increase as regards signal distortion and stability. The additional rectifying circuit is controlled by an already compressed signal. This signal is available at the same point in the circuit during compression and expansion. The distortions that occur during the matching periods due to the inclusion of the additional rectifying circuit are therefore removed again during expansion. Since however these distortions are of a high frequency nature owing to the extremely short matching periods and e.g. are smoothed out by magnetic tape recording, for slight requirements the provision of the additional rectifying circuit in the expander is not absolutely necessary and it may be switched out or omitted from the expander circuit in the case of separate circuits for compressor and expander. The signal occurring before the controllable amplifier of the control voltage generator is appreciably less delayed than the signal regulated to the dynamic value zero in the stationary condition at the output of the controllable amplifier in the control voltage generator. Moreover, the amplitude increase produced by the delayed amplitude matching is here smaller (the amplitude error increases with the number of regulated amplifiers). Both the shorter transit time and also the lower amplitude increase reduce the danger of an overswing of the control voltage. By the reduced transit time the amplification may be regulated downwardly at the beginning of a sudden amplitude increase which follows a period of very low signal amplitude. The circuit may be so designed that before the attainment of the end value of the control voltage the regular control voltage generation takes over the derivation of the control voltage, and the further rectifying circuit is put out of operation. Thereby the danger of an overswing of the control voltage is removed.

The invention will now be explained in more detail with reference to the drawing.

Figure 2:
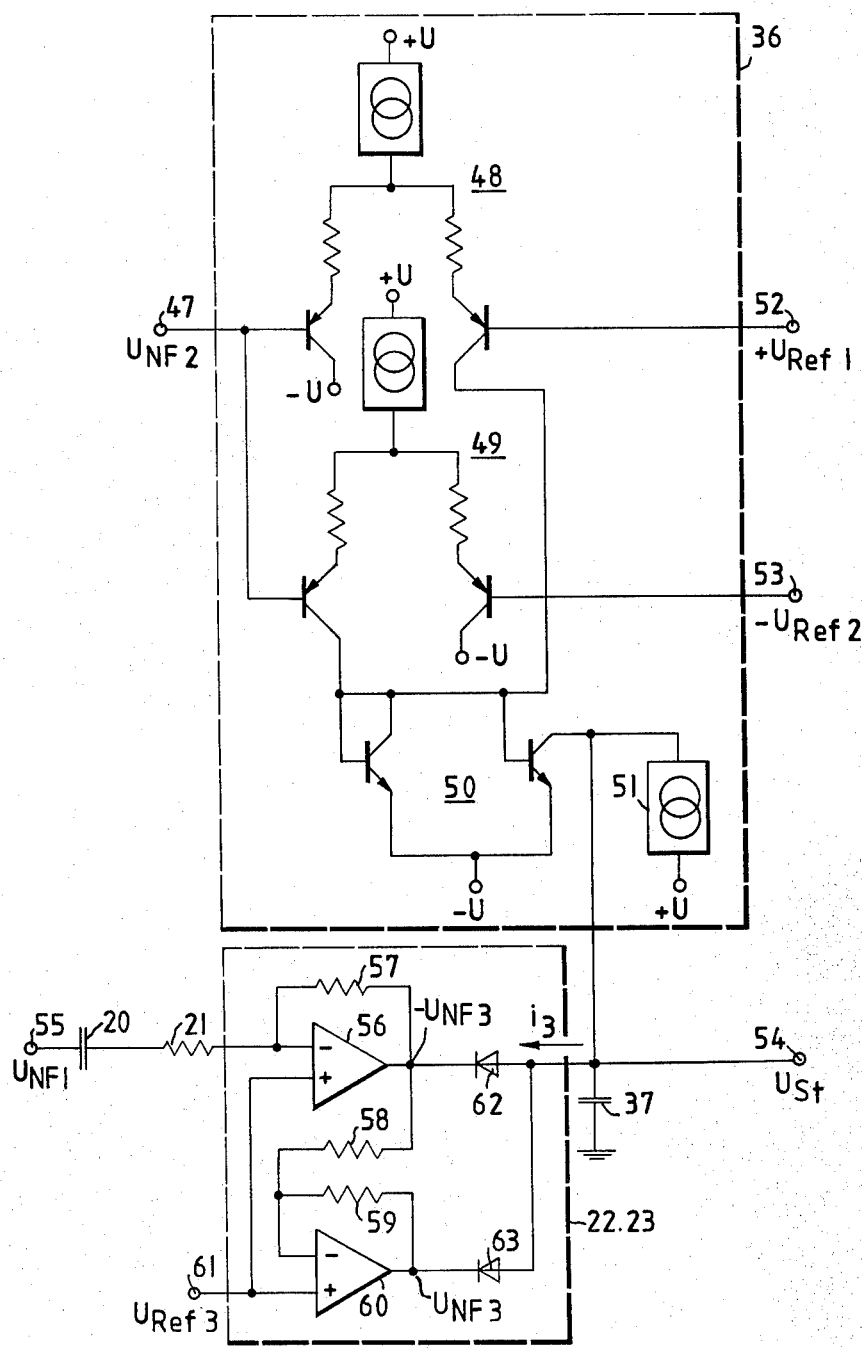

FIG. 1 shows the block circuit diagram of a two-band compander of which the control voltage generator for the highpass channel is equipped with the further rectifying circuit according to the invention, FIG. 2 shows a practical example of the further rectifying circuit according to the invention, FIG. 3 illustrates the response of the control voltage with reference to the voltage variation of a suddenly occurring input signal.

To the two-band compander illustrated in FIG. 1 input signals $U_{NFO}$ are fed via an input terminal 1, and are fed via a coupling member 2, 3 to the non-inverting input 5 of a differential amplifier 4. From the output 7 of the differential amplifier 4 a negative feedback path leads to the inverting input 6. In the "compression" operating mode the negative feedback path for the highpass channel leads via a controllable filter arrangement 24 consisting of a highpass member 25 with voltage divider 26, 28 and a controllable resistor 27, and for the lowpass channel via a controllable filter arrangement 38 consisting of a lowpass 39, 40 with a separating amplifier 41 and a voltage divider 42, 43 as well as a controllable resistor 44, to the input of an adder 45. The adder 45 is constructed as a non-inverting amplifier. From its output the negative feedback path extends further via a condenser 14, a first switch 16, a second switch 15, a further condenser 12 and a resistor 10 to the inverting input 6 of the differential amplifier 4. The direct negative feedback path for the signal via the resistors 11 and 10 is interrupted by the low-ohmic output of the adding amplifier 45. This path then serves only for the adjustment of the working point.

The signal path extends from the output 7 of the differential amplifier 4 via a condenser 13 to an output terminal 18. At this output terminal the compressed useful signals can be taken off during the "compression" operating mode. In the "expansion" operating mode the switch 15 is put into the position not shown. The negative feedback path of the differential amplifier 4 then extends from the output 7 via the resistors 11 and 10 to the inverting input 6.

The circuit elements located in the negative feedback path during the "compression" operating mode are arranged in the signal path during "expansion". The signal path then extends from the output 7 of the differential amplifier 6 via the controllable filters 24 and 38 to the adding amplifier 45 and from there via the condenser 14 and the switch 16 to the output 17. If the switch 16 is brought into the position not shown the compander is inoperative and the input signals applied to the input terminal 1 are fed at constant amplification 1 via the differential amplifier 4 and the condenser 13 to the output terminals 17 and 18.

The control of the controllable resistors 27 and 44 arranged in the controllable filter arrangements 24 and 38 respectively is effected via a control voltage which is obtained separately for each channel, in a control voltage generator 29 for the high frequency channel and in a control voltage generator 46 for the low frequency channel. The compressed signals are fed to the input of the control voltage generator 29 and, via a weighting filter 30 and a level setter 31, to an amplifier 32 controllable by means of a controllable resistor 33. The controllable resistor 33 is controlled in the same manner as the controllable resistor 27, so that during the "compression" operating mode the input signals $U_{NF0}$ are regulated to the dynamic value zero by two successively connected regulated chain amplifiers in the stationary condition. At the output of the amplifier 32 the level in the stationary condition is therefore constant. This signal passes via a voltage divider 34, 35 as signal $U_{NF2}$ to a first rectifying circuit 36, which correspondingly generates a control voltage $U_{ST1}$. In the case of normal operation this control voltage extends to the controllable resistors 33 and 27. The control voltage generator 46 for the lowpass channel is constructed similarly to the control voltage generator 29 already described. The control voltage generator 29 is designed optimally as regards signal distortions and stability.

In the event of a sudden amplitude increase the matching of the control voltage $U_{St1}$ to the amplitude value is however not sufficiently rapid, so that the output voltage $U_{NF1}$ of the compressor is not compressed but increases proportionally to the input voltage $U_{NF0}$. It is possible, in this case, to effect a limitation by diodes 8, 9 which can be inserted via a switch 19 between the output 7 and the inverting input 6 of the differential amplifier 4. As soon as the threshold voltages of the diodes 8 and 9 are exceeded the regular negative feedback path is bridged and the amplification of the differential amplifier 4 is greatly reduced. This step, however, reduces the amplification of the compressor without corresponding alteration of the control voltage. A reproducible change of amplification upon a sudden rise of amplitude is, in contrast, achieved only if the switch 19 is put into the position shown and the circuit according to the invention becomes effective.

This circuit is connected to the signal path in front of the controllable amplifier 32. It has at the input a highpass filter consisting of the condenser 20 and the resistor 21. Alternatively, a bandpass filter could be provided. To it is connected a further rectifying circuit 22 which is preferably constructed as a full-wave rectifier. Via a controlled threshold value circuit 23, the further rectifying circuit is connected to an adding circuit 37. By the adding circuit there is obtained from the output voltages of the rectifying circuits 36 and 22 a control voltage $U_{St}$ which is applied to the controllable resistors 27 and 33. In a practical form the addition circuit 37 is constructed as a load condenser to which charging currents are fed from the control voltage generator 36 and also from the further rectifying circuit 22. The charge then gives the control voltage $U_{St}$. The threshold value of the threshold value circuit 23 is controlled by the first rectifying circuit 36. Influencing of the control voltage $U_{St}$ by the further rectifying circuit 22 therefore first comes into action when the output magnitude of the further rectifying circuit 22 exceeds the prescribed threshold value. The highpass at the input of the circuit and the amplification at high frequencies are such that in the stationary condition the threshold value is not exceeded and the control voltage $U_{St}$ is determined exclusively by the first rectifying circuit 36. The circuit according to the invention is provided only in the highpass channel, since a steep rise in amplitude has the greatest effect here.

FIG. 2 shows a practical example of the further rectifying circuit 22 according to the invention. This circuit here consists of a full-wave rectifier which is formed by the diodes 62, 63, which obtain their opposed signal from the outputs of two inverting amplifiers 56, 60. The rectifier diodes 62, 63 here additionally take over the function of the controlled threshold value circuit 23. A first rectifying circuit 36 serves in the stationary condition to generate the required control voltage, which occurs at the load condenser 37 and can be taken off at the output terminal 54. The output signal $U_{NF2}$, which is constant in the stationary condition, of the controllable amplifier arranged in the control voltage generator is fed to an input terminal 47. The alternating voltage $U_{NF2}$ is applied to a comparator circuit 48 for the positive half wave and to a comparator circuit 49 for the negative half wave. Corresponding reference voltages $+U_{Ref1}$ and $-U_{Ref2}$ are applied to the comparators via input terminals 52 and 53 respectively. The output signals of the comparator circuits 48 and 49 effect, via a current reflector circuit 50, recharging of the load condenser 37 as soon as the positive and negative amplitudes of the voltage $U_{NF2}$ slightly exceed the two voltages $\pm U_{Ref\ 1,\ 2}$. The load condenser 37 is moreover continuously charged in the reverse direction by a constant source 51. The control voltage on the load condenser always adjusts itself so that via the amplifier controlled by it the amplitude $U_{NF2}$ at the input of the comparator circuits is kept constant at the value at which the references voltages are just slightly exceeded, so that the alteration of charge caused by the constant current source is annulled. During the matching periods the charge alteration caused by the comparator circuit or by the constant current source preponderates as required.

The further rectifying circuit is connected to the signal path $U_{NF1}$ in front of the controllable amplifier 32 provided in the control voltage generator 29. The compressed voltage $U_{NF1}$ is fed to this rectifying circuit via an input terminal 55. The signals pass via a highpass member made up of the condenser 20 and the resistor 21 to a full-wave rectifying circuit consisting of a first inverting amplifier 56 having a first rectifier diode 62 and a second inverting amplifier 60 having a second rectifier diode 63. The output of the first inverting amplifier is on the one hand connected directly to the cathode of the rectifier diode 62 and on the other hand via a resistor 58 to the input of the inverting amplifier 60. The output of this amplifier is connected to the cathode of the rectifier diode 63. The anodes of the two rectifier diodes are connected to one another and to the voltage-supplying terminal of the condenser 37. The amplification of the inverting amplifier 60 is adjusted by the resistors 58 and 59 to the value −1. The resistors 57, 58 and 59 are preferably of the same value, in order that the working points of the two amplifiers 56 and 60 may be the same. The two non-inverting inputs of the amplifiers 56 and 60 are subject via a terminal 61 to a voltage $U_{Ref3}$, which is so adjusted that the diodes 62 and 63 are just not opened by the maximum value of $U_{St}$, which here adjusts itself to $U_{NF1}=0$.

The operation of the circuit will now be explained with reference to FIG. 3. FIG. 3 illustrates, with reference to the curve of a useful signal, the treatment of the signal within the comparator circuit and the derivation of the control voltage. FIG. 3a shows an input signal $U_{NF0}$ critical for the compander. The amplitude of a signal of e.g. 10 kHz rises suddenly from zero to a high value. Before the commencement of the increase the compression circuit is adjusted to maximum amplification. After the start of the signal some time is required to regulate the amplification back to the required value that corresponds to the signal amplitude. In FIG. 3b the output signal $U_{NF1}$ of the compressor is illustrated. The high peak occurs when no limitation is provided. With diode limitation the peak is lowered to a smaller value. This value is dependent on the difference in amplitude between the input and the output of the compressor, since the limiting diodes are opened by the voltage difference. The voltage difference may not however be of any high value, in order that the limiting diodes may not respond at high amplitudes in the stationary condition.

FIG. 3c shows the signal $U_{NF2}$ regulated to the dynamic value zero in the stationary condition before the first rectifying circuit 36 for generating the control voltage. The peak values of signal voltage attained in the response condition are determined by the two voltages $\pm U_{Ref\,1,2}$. Only with a very small input signal are the peak values not attained. In the circuit shown in FIG. 2, each time the voltage $\pm U_{Ref\,1,2}$ is exceeded a current pulse is generated which discharges the container 37 via the current reflector circuit 50. FIG. 3d shows the direction of the control voltage in accordance with the alternating voltage $U_{NF3}$ occurring at the further rectifying circuit. In no-load operation without signal the direct voltage peak at the cathodes of the diodes 62 and 63 is so adjusted via a reference voltage $U_{Ref3}$ that the diodes just do not open in response to the no-load control voltage $U_{St}$ on the load condenser 37. Upon a sudden signal increase the diodes 62 and 63 become conducting and the condenser 37 is rapidly discharged. The current flow angle for this operating condition is illustrated by the shaded area in FIG. 3d. Since the change of control voltage effects a return of the amplification, after a short time the condition occurs in which the alternating voltage $U_{NF3}$ no longer attains the pass voltages of the diodes relative to the altered value of the control voltage $U_{St}$. The rapid recharging by the further rectifying circuit is then ended, and the adjustment of the control voltage $U_{St}$ to the stationary condition occurs solely via the first rectifying circuit 36. The control voltage $U_{St}$ varies very rapidly owing to the current i3 delivered by the further rectifying and threshold value circuit 22, 23. Owing to this rapidly acting regulation and the additionally starting regular control voltage generation with the first rectifying circuit 36, during the first amplitude increase the amplification is still kept down so far that the diodes are closed again before the attainment of the full amplitude value of the useful signal variations and thus exceeding of the control voltage $U_{St}$ is prevented.

FIG. 3e shows the compressor output signal $U_{NF1}$ upon amplification regulations via the adjusting members by means of the control voltage generated by the circuit according to the invention. The peak in the case of the first amplitude increase is reduced relative to the LF signal in FIG. 3d, since in the signal $U_{NF3}$ the peaks are raised by the highpass 20, 21.

The further rectifying circuit according to the invention is effectively only for extreme signals. It prevents the occurrence in the compressor output signal of amplitude peaks that lead to over-control. It is thus possible to convert even LF voltages of extreme sound events into compressed signals suitable for magnetic tape recording, so that they can subsequently be reproduced undistorted via the expander.

I claim:

1. In a control voltage generator for use in a dynamic compression/expansion system presenting an intelligence signal path, which control voltage generator includes a first controllable amplifier, a first rectifying circuit connected in series with the amplifier, with the input of the rectifying circuit being connected to the output of the amplifier, and means for connecting the input of the amplifier to the intelligence signal path of the system, the improvement comprising a further rectifying circuit having an input connected to the intelligence signal path at a point ahead of the input of said first controllable amplifier, and means connected for combining the signals at the outputs of said first and further rectifying circuits to produce a control signal applied to control the gain of said controllable amplifier, whereby the output signal provided by said further rectifying circuit serves to shorten the response time of said control voltage generator.

2. Control voltage generator according to claim 1, characterised in that the further rectifying circuit (22) is operative only in the "compression" mode.

3. Control voltage generator according to claim 1 wherein said signal combining means comprise an adding circuit connected for causing the value of the control signal to be proportional to the sum of the values of the signals at the outputs of said first and further rectifying circuits.

4. Control voltage generator according to claim 3, characterised in that the further rectifying circuit (22) is connected to the adding circuit (37) via a threshold value circuit (23) the threshold value of which is controllable in accordance with the control voltage of the first rectifying circuit (36).

5. Control voltage generator according to claim 4, characterised in that the further rectifying circuit (22) includes diodes (62, 63) which at the same time form the threshold value circuit (23) (FIG. 2).

6. Control voltage generator according to claim 1 wherein the signals at the outputs of said first and further rectifying circuits are in the form of currents, and said combining means comprise a load capacitor connected to integrate currents at the outputs of said first and further rectifying circuits to produce the control voltage constituting the control signal.

7. Control voltage generator according to claim 6, characterised in that the further rectifying circuit includes two inverting amplifiers (56, 60) connected in series, that the output of the first amplifier (56) is connected to a first diode (62) and the output of the second amplifier (60) is connected to a second diode (63), and that the other two terminals of the diodes (62, 63) are connected to the load condenser (37).

8. Control voltage generator according to claim 7, characterised in that similar resistors are (57, 59) provided in the negative feedback path of the inverting amplifiers (56, 60) and that the second amplifier has the amplification −1.

9. Control voltage generator according to one of claims 1, 3, 4, 6, or 5, characterised in that the input of the further rectifying circuit (22) is connected to the signal path ($U_{NF1}$) via a highpass (20, 21) or a bandpass filter.

10. Control voltage generator according to claim 9, characterised in that the whole frequency spectrum occurring in the system for dynamic compression and/or expansion is treated in one channel.

11. Control voltage generator according to claim 9, characterised in that the frequency spectrum occurring in the system for dynamic compression and/or expansion is treated in a plurality of channels and that the further rectifying circuit (22) is provided at least in the control voltage generator for the highest frequency channel.

12. Control voltage generator according to claim 11, characterised in that a further rectifying circuit (22) is provided in all channels.

13. Control voltage generator according to claim 11, characterised in that the further rectifying circuit (22) is connected to follow a weighting filter (30) of the respective channel.

* * * * *